(12) United States Patent
Hsu et al.

(10) Patent No.: US 7,209,395 B2
(45) Date of Patent: Apr. 24, 2007

(54) LOW LEAKAGE AND LEAKAGE TOLERANT STACK FREE MULTI-PORTED REGISTER FILE

(75) Inventors: Steven K. Hsu, Lake Oswego, OR (US); Amit Agarwal, West Lafayette, IN (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 10/953,202

(22) Filed: Sep. 28, 2004

(65) Prior Publication Data

US 2006/0067136 A1    Mar. 30, 2006

(51) Int. Cl.
G11C 7/00 (2006.01)
G11C 8/00 (2006.01)

(52) U.S. Cl. ............................ 365/189.12; 365/230.05; 365/203

(58) Field of Classification Search ........... 365/189.12, 365/230.05, 203, 154, 156
See application file for complete search history.

(56) References Cited

U.S. PATENT DOCUMENTS

| | | | | |
|---|---|---|---|---|
| 5,642,325 A | * | 6/1997 | Ang .................... | 365/230.05 |
| 5,724,299 A | * | 3/1998 | Podlesny et al. ...... | 365/230.05 |
| 5,793,681 A | * | 8/1998 | Nii ........................ | 365/230.05 |
| 5,901,079 A | * | 5/1999 | Chiu et al. ............. | 365/230.05 |
| 5,959,931 A | * | 9/1999 | Ueda ..................... | 365/230.05 |
| 6,215,694 B1 | * | 4/2001 | Li et al. ................ | 365/230.05 |
| 6,320,795 B1 | * | 11/2001 | Balamurugan et al. | 365/230.05 |
| 6,388,940 B1 | * | 5/2002 | Alvandpour et al. ... | 365/230.05 |
| 6,834,024 B2 | * | 12/2004 | Frydel ................... | 365/230.05 |
| 6,903,996 B2 | * | 6/2005 | Slamowitz et al. .... | 365/230.05 |
| 6,987,686 B2 | * | 1/2006 | Kim et al. ............. | 365/230.05 |
| 7,016,239 B2 | * | 3/2006 | Chatterjee et al. ..... | 365/189.12 |

* cited by examiner

Primary Examiner—Trong Phan
(74) Attorney, Agent, or Firm—Schwegman, Lundberg, Woessner & Kluth, P.A.

(57) ABSTRACT

A device includes a number of memory cells. Each of the memory cells includes a transistor stack coupled to a bit line. A value of a charge on the bit line during an access mode represents a value of data stored in an accessed memory cell. During a non-access mode, all transistors of the transistor stack are turned off to save power. The transistors are turn off regardless of the value of the data stored in the memory cells.

29 Claims, 7 Drawing Sheets

FIG. 1

| | 124 | 151 | 152 | | 162 | 164 |
|---|---|---|---|---|---|---|
| SEL0 | NODE | TRANSISTOR | TRANSISTOR | BL | PG | TRANSISTOR |
| 204 → 0 | 0 | OFF | OFF | 1 | OFF | ON |
| 203 → 0 | 1 | OFF | OFF | 1 | ON | OFF |
| 202 → 1 | 0 | ON | OFF | 1 | OFF | ON |
| 201 → 1 | 1 | ON | ON | 0 | ON | OFF |

LOW LEAKAGE AND LEAKAGE TOLERANT STACK FREE MULTI-PORTED REGISTER FILE

FIELD

Embodiments of the present invention relate to integrated circuits, and more particularly, to memory circuits.

BACKGROUND

Integrated circuits such as processors and memory devices reside in many computers and electronic products. Some integrated circuits store data in memory cells of a memory circuit or register file.

Some register files keep an amount of charge at a local bit line to represent a value of the data stored in a memory cell. The charge from the local bit line is susceptible to leakage. False data may occur when the charge leaks below an acceptable level. Thus, most register files have mechanisms to control the charge leakage. However, as integrated circuits are designed with smaller circuit elements such as smaller transistors, designing mechanisms to control the charge leakage in register files becomes a challenge.

DESCRIPTION OF EMBODIMENTS

The following description and the drawings illustrate specific embodiments of the invention sufficiently to enable those skilled in the art to practice the embodiments of the invention. Other embodiments may incorporate structural, logical, electrical, process, and other changes. In the drawings, like features or like numerals describe substantially similar components throughout the several views. Examples merely typify possible variations. Portions and features of some embodiments may be included in or substituted for those of others. The scope of the invention encompasses the claims and all available equivalents.

Figure 1:
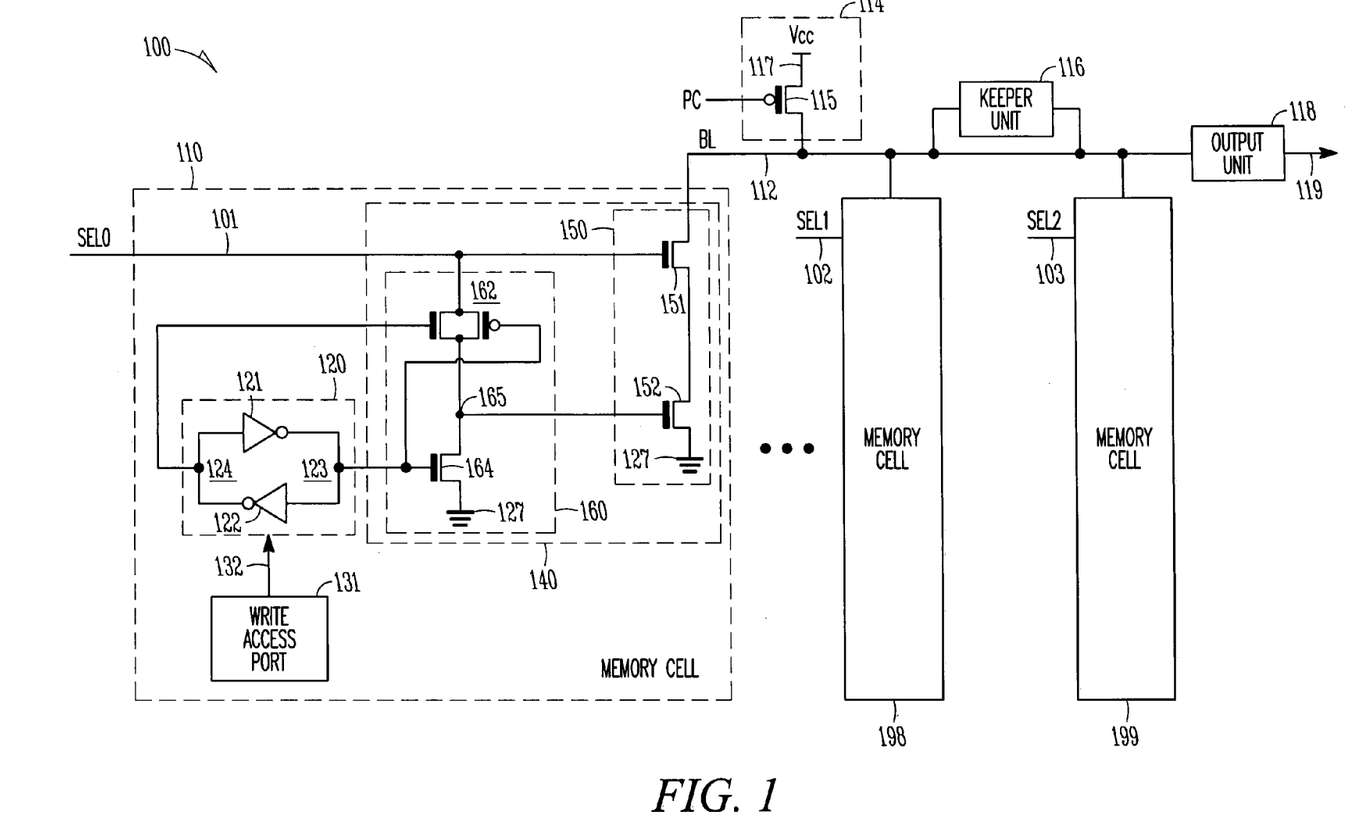
FIG. 1 shows a device having memory cells according to embodiments of the invention.

FIG. 1 shows a device having memory cells according to embodiments of the invention. Device 100 may be a memory device or a processing unit such as a microprocessor. For simplicity, FIG. 1 shows only the memory cell portion of device 100. Device 100 includes memory cells 110, 198 and 199, select lines 101, 102, and 103, and associated select signals SEL0, SEL1, and SEL3. Memory cells 110, 198, and 199 connect to a bit line 112 with a bit line signal BL, a precharge unit 114, a keeper unit 116, and an output unit 118.

For simplicity, FIG. 1 shows detailed structure of only memory cell 110. Each of the other memory cells 198 and 199 has a structure similar to the structure of memory cell 110. Memory cell 110 includes a memory unit 120 to store data. Memory unit 120 includes a pair of storage nodes 123 and 124 formed between a pair of inverters 121 and 122.

A write access port 131 of memory cell 110 transfers data to memory unit 120 via path 132 during a write operation. In some embodiments, path 132 includes multiple lines to transfer multiple data bits. For example, path 132 may include a pair of lines to transfer a pair of data bits having complementary values.

A read access port 140 of memory cell 110 enables bit line 112 to reflect the data stored memory unit 120 during a read operation.

Output unit 118 transfers the data from bit line 112 to an output node 119. In some embodiments, output circuit 118 may includes an inverter or a static circuit such as a NOR gate to invert the data on bit line 112 before the data on bit line 112 is provided to output node 119.

Precharge unit 114 responds to a signal PC to charge bit line 112 to a precharged value. In some embodiments, the PC signal is a clock signal. The PC signal has signal levels corresponding to a precharge phase and an evaluation phase of device 100. During the precharge phase, bit line 112 is charged to the precharged value. During the evaluation phase, device 100 evaluates the charge on bit line 112 to obtain the value of the data stored in memory cell 110.

The PC signal is low during the precharge phase. The PC signal is high during the evaluation phase. When the PC signal is low during the precharge phase, transistor 115 turns on and connects bit line 112 to a supply node 117, thereby charging bit line 112 to a supply voltage (Vcc) at supply node 117. Thus, during the precharge phase, bit line 112 has a precharged value equal to Vcc (high). When the PC signal is high during the evaluation phase, transistor 115 turns off. Therefore, bit line 112 is disconnected from supply node 117 during the evaluation phase.

Keeper unit 116 conditionally keeps bit line 112 at the precharged value during the evaluation phase or allow bit line 112 to discharge to ground and become low (ground) during the evaluation phase. For example, in a first condition during the evaluation phase where the bit value at storage node 124 of memory unit 120 is a logic zero (low), keeper unit 116 keeps bit line 112 at the precharged value (Vcc or high). In a second condition during the evaluation phase where the bit value at storage node 124 is a logic one (high), keeper unit 116 releases control of bit line 112, thereby allowing bit line 112 to discharge to ground (low). The low and high values on bit line 112 during the evaluation phase reflect the value of the data stored in memory cell 110.

In memory cell 110, access port 140 responds to the SEL0 signal during a read operation to read data in memory unit 120. The read operation occurs during the evaluation phase. The SEL0 signal is activated high during the read operation in which the PC signal is high and precharge unit 114 is deactivated. The SEL0 is deactivated (low) in the precharge phase in which the PC signal is low and precharge unit 114 is activated.

Access port 140 includes a transistor stack 150 and an isolation unit 160. Transistor stack includes transistors 151 and 152 coupled in series between bit line 112 and supply node 127. Isolation unit 160 includes a pass gate 162 and a transistor 164. Pass gate includes a first pass node connected to select line 101, a second pass node connected to the gate of transistor 152 at node 165, and pass gate control nodes coupled to storage nodes 123 and 124.

When memory cell 110 is accessed during a read operation in the evaluation phase, transistors 151 and 152 conditionally form path between bit line 112 and supply node 127 based on the bit value of storage node 124 to allow bit line 112 to discharge to supply node 127.

When memory cell 110 is not accessed during the precharge phase, isolation unit 160 isolates transistor stack 150 from memory unit 120 so that both transistors 151 and 152 are off, regardless of the bit value stored in memory unit 120.

Figure 2:
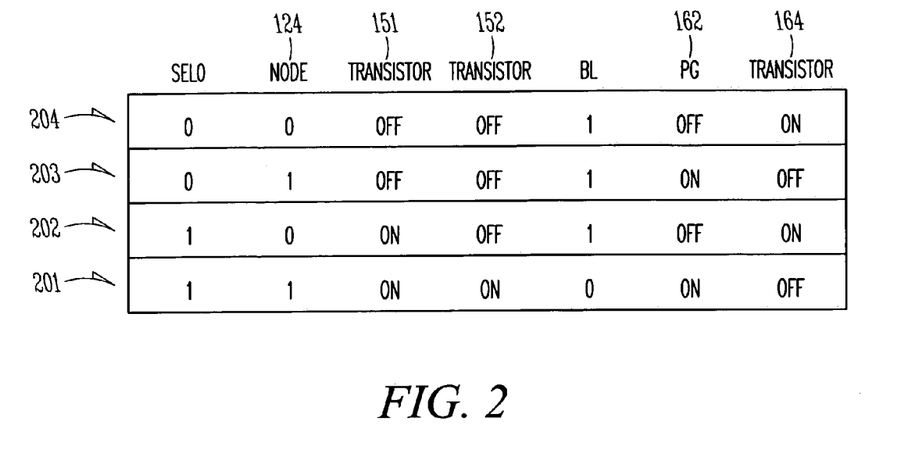
FIG. 2 is a table showing conditions of the device of FIG. 1.

FIG. 2 is a table showing conditions device 100 of FIG. 1. In FIG. 2, zero (0) represents logic zero or low such as ground, one (1) represents logic one or high such as Vcc. ON indicates that a transistor or a pass gate (PG) is in a conductive state. OFF indicates that a transistor or a pass gate is not in a conductive state. FIG. 2 shows four possible conditions 201, 202, 202, and 204 of the combinations of the SEL0 signal and the bit value of storage node 124. Memory cell 110 of FIG. 1 is accessed to read data in storage node 124 when the SEL0 signal is high such as in conditions 201 and 202. Memory cell 110 is not accessed when the SEL0 signal is low such as in conditions 203 and 204.

In condition 201, the SEL0 signal and storage node 124 are both high. When storage node 124 is high, pass gate 162 turns on and connects gates of transistors 151 and 152 to select line 101. Since the SEL0 signal on select line 101 is high, both transistors 151 and 152 turn on and form a path between bit line 112 and supply node 127. Bit lines 112 discharges to supply node 127 through transistors 151 and 152 and becomes low. Thus, in condition 201 the low value of bit line 112 corresponds to the high value of storage node 124.

In condition 202, the SEL0 signal is high and storage node 124 is low. When storage node 124 is low, pass gate 162 turns off. Transistor 164 turns on, connecting the gate of transistor 152 to ground. Thus, transistor 152 turns off. Since transistor 152 is off, the combination of transistors 151 and 152 does not form a path between bit lines 112 and supply node 127. Therefore, bit line 112 retains the precharged value, which is high. Thus, in condition 202 the high value of bit line 112 corresponds to the low value of storage node 124.

In conditions 203 and 224, the SEL0 signal is low, meaning memory cell 110 is not accessed. Both transistors 151 and 152 are off, regardless the values of storage node 124.

As described above in FIG. 1 and FIG. 2, in the case where memory cell 110 is accessed, the amount of charge on bit line 112 represents the bit value of the data stored memory unit 120 of memory cell 110. For example, bit line 112 retains the charge at the precharged value to represent a first value (e.g., low) of memory unit 120; bit line 112 discharges and becomes low or ground to represent a second value (e.g., high) of memory cell 110.

In the case when none of the memory cells 110, 198, and 199 of FIG. 1 is accessed, the charge (at the precharged value) of bit line 112 may leak through a path such as the path formed by transistors 151 and 152 of transistor stack 150 between bit line 112 and supply node 127 in each of the memory cells 110, 198, and 199. However, since each of the memory cells 189 and 199 is not accessed, all transistors in the transistor stack of each of the memory cells 110, 189, and 119 are in the off state, regardless of the value stored in the memory unit of each of the memory cells 110, 198, and 199. Therefore, when memory cells 110, 198, and 199 are not accessed, any possible leakage from bit line 112 through the transistor stacks in memory cells 110, 198, and 199 is reduced because all of the transistors in the transistor stacks are in the off state. Hence, device 100 of FIG. 1 has reduced or low leakage memory cells.

Further, device 100 has a high leakage tolerance such that false read of data or false evaluation may not occur during the evaluation phase when a memory cell is accessed. For example, when only memory cell 110 is accessed and all other memory cells such as memory cells 198 and 199 are not accessed, bit lines 112 retains the charge at the precharged value to reflect the value stored (e.g. low) in the accessed memory cell 110. This example corresponds to condition 201 of FIG. 2. In condition 201, a discharge path between bit line 112 and supply node 127 does not exist in memory cell 110 because both transistors 151 and 152 of memory cell 110 are in the off state. In the above example where only memory cell 110 is accessed and memory cells 198 and 199 are not accessed, all transistors in the transistor stack in each of the other memory cells 198 and 199 are also in the off state, regardless of the values stored memory cells 198 and 199. Therefore, during the evaluation phase of the accessed memory cell 110, any possibility of leakage from bit line 112 through the transistor stack of each of the other non-accessed memory cells 198 and 199 is reduced. As a result, the possibility of false evaluation is prevented or reduced.

As discussed in the description of FIG. 1 and FIG. 2 above, since device 100 has a low leakage, leakage power consumption of device 100 is reduced when the memory cells of device 100 are not accessed. Moreover, since device 100 has a high leakage tolerance at bit line 112 during evaluation, a relatively higher number of memory cells may be connected to bit line 112. Thus, the ratio of memory cells per bit line is increased, thereby increasing the storage capacity per unit area of device 100.

In addition, since device 100 has a low leakage at bit line 112, a need for larger than normal keeper unit 116 to sustain the leakage may be eliminated. For example, without turning off transistors 151 and 152 when memory cell 110 is not accessed, the charge from bit line 112 may leak. To sustain the leak, keeper unit 116 is constructed with a specific size such as a specific ratio of channel width to channel length. However, since transistor 151 and 152 of memory cell 110 are turned off when memory cell is not accessed, any possibility of leakage through transistors 151 and 152 may be absent or reduced. Therefore, when used with memory cells 110, 189, and 199, keeper unit 116 may be constructed with a size that is smaller than the specific size where keeper unit 116 is used in a device having memory cells with different structure from the structure of memory cell 110. For example, transistors of keeper unit 116 may be constructed with a reduced effective ratio of channel width to channel length. As a result of the reduced sized, keeper unit 116 may allow less contention between keeper unit 116 and transistor stack 150 during the evaluation phase. Therefore, bit line 112 may discharge quicker through transistor stack 150 during an evaluation phase where device 100 has a condition such as condition 201 of FIG. 2. A quicker discharge may improve the overall performance of device 100.

Moreover, as circuit elements such as transistors scale to a smaller dimension, the threshold voltage of the transistors is also reduced. In some devices, the inclusion of low threshold voltage transistors may not be possible because the low threshold voltage transistors may not sustain the charge of the bit line such as bit line 112 at an acceptable value during the evaluation phase. However, since device 100 has a low leakage and a high leakage tolerance, device 100 allows the inclusion of low threshold voltage transistors.

Figure 3:
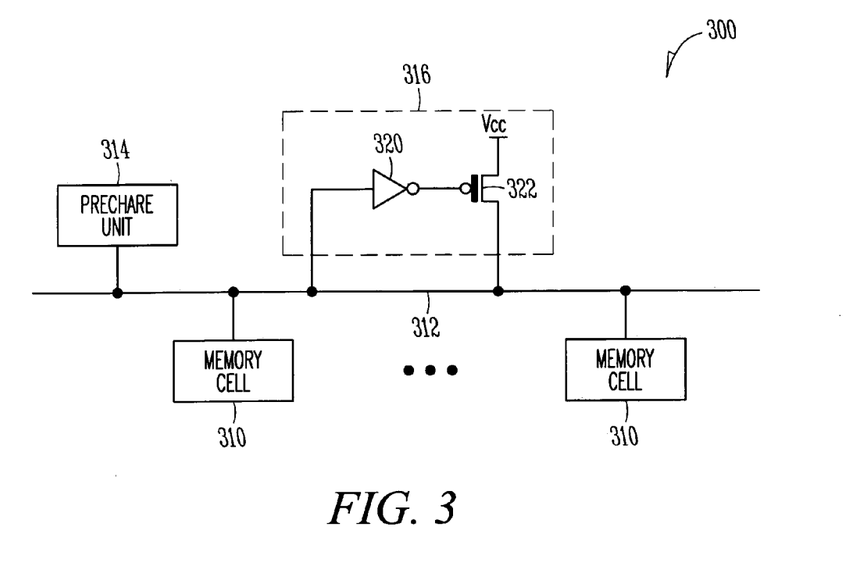
FIG. 3 shows a device with keeper unit according embodiments of the invention.

FIG. 3 shows a device with a keeper unit according embodiments of the invention. Device 300 includes memory cells 310, a precharge unit 314, a bit line 312, and a keeper unit 316. In some embodiments, device 300 includes embodiments of device 100 of FIG. 1 such that precharge unit 314 includes embodiments of precharge unit 114 of FIG. 2 and each of the memory cells 310 includes embodiments of memory cell 110 of FIG. 1.

In FIG. 3, keeper unit 316 includes an inverter 320 and a transistor 322 forming a control loop having control nodes connected to bit line 312. Keeper unit 316 keeps bit line 312 at Vcc when precharge unit 314 is activated during a precharge phase such as during the precharge phase described in FIG. 1 and FIG. 2. Keeper unit 316 conditionally keeps bit line 312 at Vcc or allows bit line 312 to discharge to ground when precharge unit 314 is deactivated during an evaluation phase such as during the evaluation phase described in FIG. 1 and FIG. 2.

In some embodiments, keeper unit 316 substitutes keeper unit 116 of FIG. 1. Thus, when keeper unit 316 is used in device 100 of FIG. 1, keeper unit 316 may be constructed with a size that is smaller than the specific size because device 100 has a low leakage and high leakage tolerance as described in FIG. 1 and FIG. 2. FIG. 1 and FIG. 2 disclose that the specific size of a keeper unit refers to the size of the keeper unit used with a memory cell having a different structure from memory cell 110 of device 100. Therefore, when keeper unit 316 is used in a device 100 of FIG. 1, inverter 320, transistor 322, or both may have a smaller size such as a smaller effective ratio of the channel width to channel length. A smaller keeper unit reduces contention, leading to improve performance of device 300.

Figure 4:
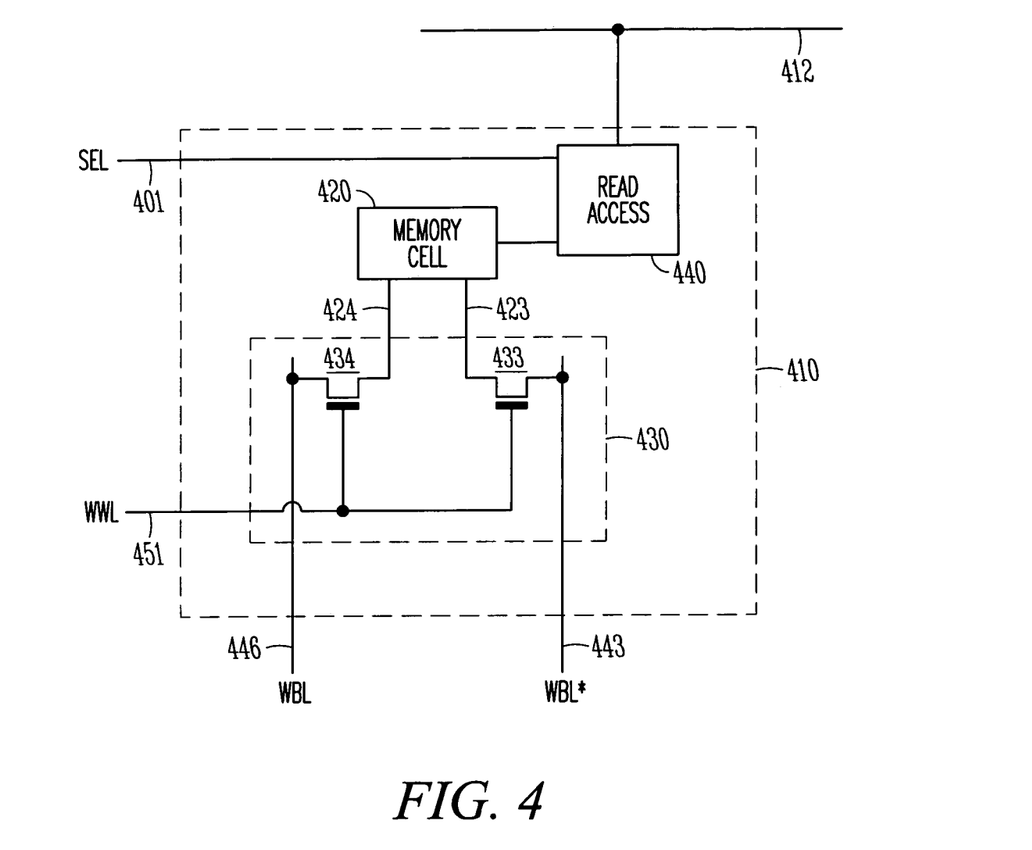
FIG. 4 shows a memory cell with a write access port according embodiments of the invention.

FIG. 4 shows a memory cell with a write access port according embodiments of the invention. Memory cell 410 includes a memory unit 420, a write access port 430, and a read access port 440. Read access port 440 responds to a select signal SEL on a select line 401 to allow a bit line 412 to reflect data stored in memory unit 420 during a read operation. In some embodiments, read access port 440 includes embodiments of read access port 140 of FIG. 1.

Write access port 430 responds to a write word line signal WWL on a write word line 451 to transfer data (represented by WBL and WBL* signals) from write bit lines 443 and 446 to memory unit 420. In some embodiments, the WBL and WBL* signals represent complementary data. Write access port 430 includes a pair of transistors 433 and 434 with gates connected to write bit line 451. Transistor 433 responds to the WWL signal to transfer data on write bit line 443 to line 423. Transistor 434 responds to the WWL signal to transfer data on write bit line 446 to line 424. Data from lines 423 and 424 are transferred to storage nodes of memory unit 420. In some embodiments, memory unit 420 includes a pair of storage nodes such as storage nodes 123 and 124 of FIG. 1. In these embodiments, lines 423 and 424 connect to the pair of storages nodes of memory unit 420.

Figure 5:
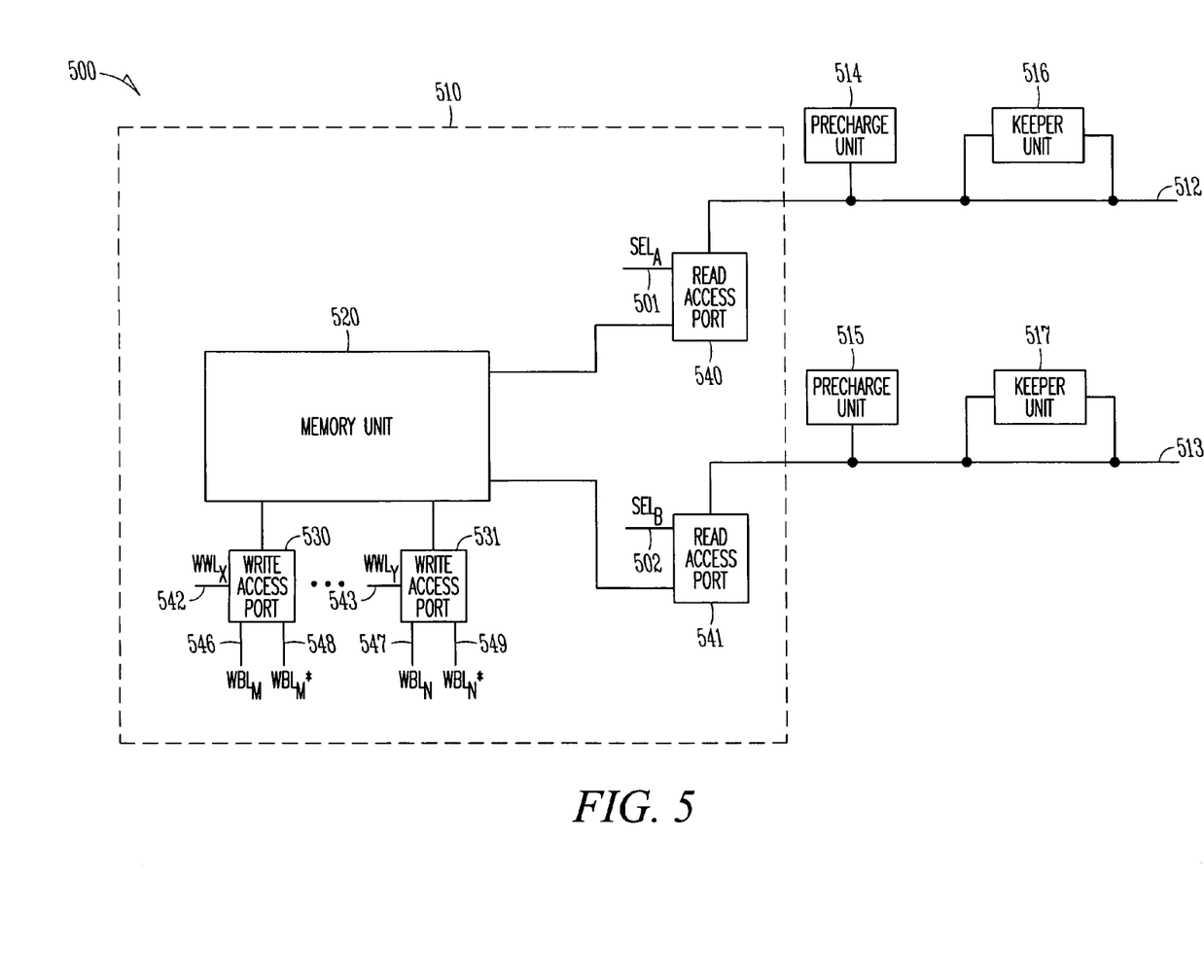
FIG. 5 shows device having a multi-ported memory cell according embodiments of the invention.

FIG. 5 shows a device having a multi-ported memory cell according embodiments of the invention. Device 500 includes a memory cell 510. Device 500 also includes other memory cells and associated components similar to memory cells 510. For simplicity, the other memory cells are omitted from FIG. 5. Memory cell 510 having a memory unit 520, multiple write access ports 530 and 531, and multiple read access ports 540 and 541. Device 500 further includes a precharge unit 514 and a keeper unit 516 connected to a bit line 512, and a precharge unit 515 and a keeper unit 517 connected to a bit line 513. Each of the precharge units 514 and 515 performs a function similar to the function of precharge unit 114 of FIG. 1. Each of the keeper units 516 and 517 of FIG. 5 performs a function similar to the function of keeper unit 116 of FIG. 1.

Read access port 540 responds to a select signal $SEL_A$ on a select line 501 to allow bit line 512 to provide data stored in memory unit 520. Read access port 541 responds to a select signal $SEL_B$ on a select line 502 to allow bit line 513 to provide data stored in memory unit 520. Each of the read access ports 540 and 541 includes embodiments read access port 140 of FIG. 1.

Write access port 530 responds to a write word line signal $WWL_X$ on write word line 542 to transfer data ($WBL_M$ and $WBL_M^*$) from write bit lines 546 and 548 to memory unit 520. Write access port 531 responds to a write word line signal $WWL_Y$ on write word line 543 to transfer data ($WBL_N$ and $WBL_N^*$) from write bit lines 547 and 549 to memory unit 520. In some embodiments, each of the write access ports 530 and 531 includes embodiments write access port 130 of FIG. 1 or embodiments of write access port 430 of FIG. 4.

FIG. 5 shows memory cell 510 having a memory unit connected to the same number (two) of read access ports and write access ports, as an example. Each of the number of the read access ports and the number of the write access ports may be different from two. The number of the read access ports is independent from the number of the write access ports.

Figure 6:
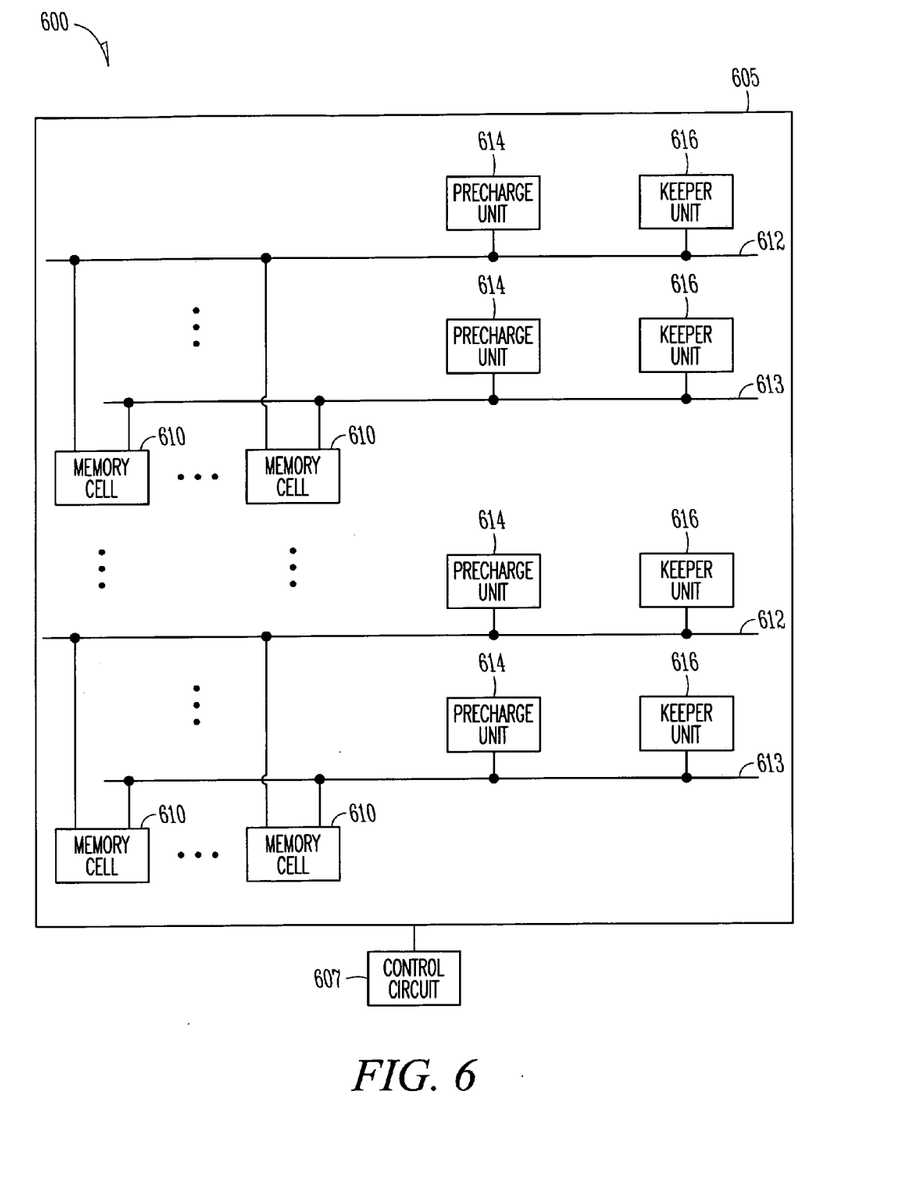
FIG. 6 shows a device having a register file according embodiments of the invention.

FIG. 6 shows a device having a register file according embodiments of the invention. Device 600 includes a register file formed by a memory array 605 to store data, and a control circuit 607 to provide access to memory array 605 during read and write operations of device 600. Device 600 also includes a number of bit lines 612, a number of bit lines 613, precharge units 614, and keeper units 616.

Each of the memory cells 610 includes embodiments of memory cell 510 of FIG. 5. Thus, each of the memory cells 610 includes multiple read access ports, multiple write access ports, an associated select line, write word lines, and write bit lines. For simplicity, FIG. 6 omits details of memory cells 610. Since each of the memory cells 610 of the register file of device 600 includes multiple read ports and multiple write ports, the register file of device 600 is a multi-ported register file. Further, since memory cells 610 include embodiments of memory cell 110 (FIG. 1) in which all transistors of transistor stack 150 turn off regardless of the bit value of the memory cell when the memory cell is not accessed, the register file of device 600 is a stack free multi-ported register file.

In some embodiments, device 600 is a processor in which memory array 605 is included in a cache memory circuit of the processor.

Figure 7:
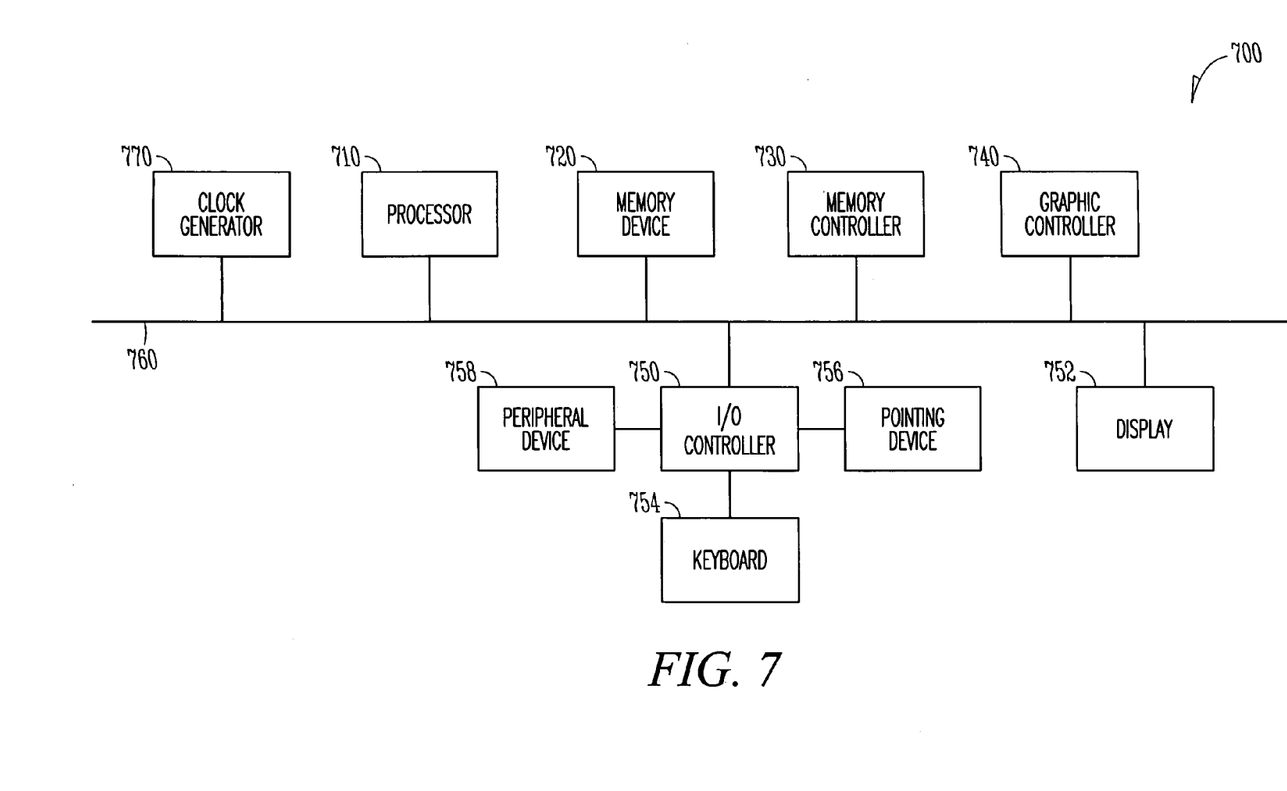
FIG. 7 shows a system according to embodiments of the invention.

FIG. 7 shows a system according to embodiments of the invention. System 700 includes processing unit or processor 710, a memory device 720, a memory controller 730, a graphic controller 740, an input and output (I/O) controller 750, a display 752, a keyboard 754, a pointing device 756, and a peripheral device 758. A bus 760 connects all of these devices together. A clock generator 770 provides a clock signal to at least one of the devices of system 700. In some embodiments, system 700 may omit one or more devices shown in FIG. 7. In some embodiments, two or more devices shown in system 700 may be formed in a single chip.

Bus 760 may be conducting traces on a circuit board or may be one or more cables. Bus 760 may also connect the devices of system 700 by wireless means such as electromagnetic radiation (e.g., radio waves). Peripheral device 758 may be a printer, an optical device (e.g., a CD-ROM device or a DVD device), a magnetic device (e.g., floppy disk driver), or an audio device (e.g., a microphone). Memory device 720 may be a dynamic random access memory (DRAM) device, a static random access memory (SRAM) device, a flash memory device, or a combination thereof. In some embodiments, memory device is a cache memory device.

At least one of the devices shown in system 700 includes embodiments of FIG. 1 through FIG. 6. Thus, at least one of the devices shown in system 700 includes embodiments a memory cell such as memory cell 110, 410, or 510. Further, at least one of the devices shown in system 700 includes embodiments a low leakage and high leakage tolerance device such as the devices described in FIG. 1 through FIG. 6.

System 700 of FIG. 7 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

Figure 8:
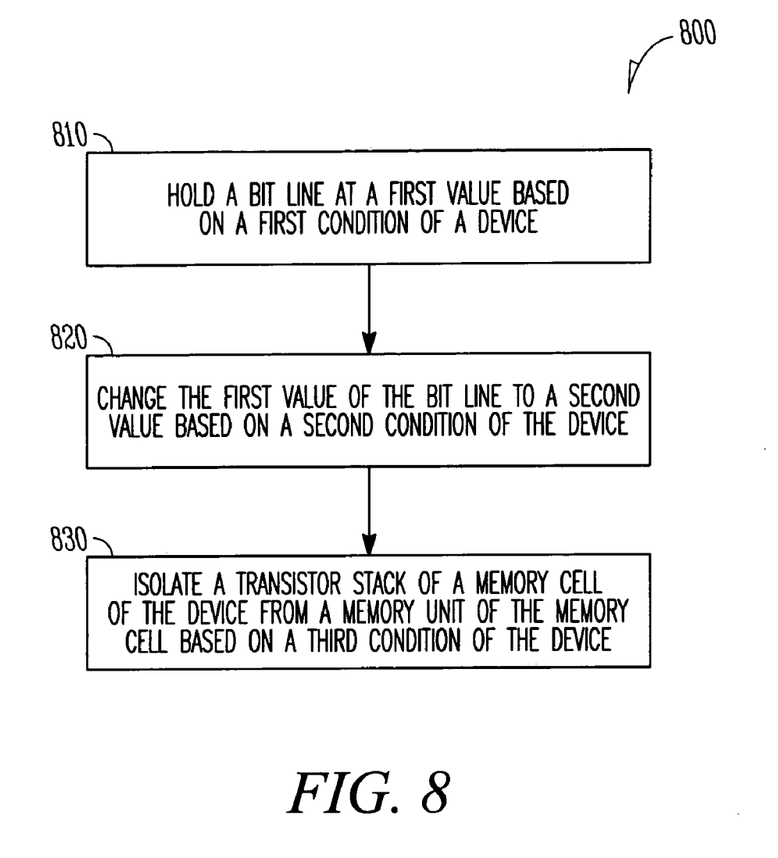
FIG. 8 is a flowchart of a method of controlling leakage in a register file according to embodiments of the invention.

FIG. 8 is a flowchart of a method of controlling leakage in a device according to embodiments of the invention.

Box 810 holds a bit line at a first value based on a first condition of the device. The first condition includes a condition of a combination of a select line and a bit value of data stored in a memory cell connected to the bit line. For example, box 810 holds the bit line high when a select line connected to the memory cell is activated and the bit value of the data is a logic zero or low.

Box 820 changes the first value of the bit line to a second value based on a second condition of the device. The second condition includes a condition of the combination of the select line and the bit value of data stored data stored in the memory cell. For example, box 820 holds the bit line low when the select line is activated and the bit value of data is a logic one or high.

In some embodiments, the first and second conditions in boxes 810 and 820 correspond to conditions 201 and 202 of FIG. 2.

Box 830 isolates a transistor stack of the memory cell from a memory unit of the memory cell based on a third condition of the device. The third condition includes the condition of where the select line is deactivated. In some embodiments, the select line is activated when it is high and deactivated when it is low. Box 830 isolates the transistor stack of the memory cell from the memory unit of the memory cell when the select line is deactivated regardless of the bit value of data stored in the memory cell. Box 830 is performed in a condition corresponding to any one of the conditions 203 and 204 of FIG. 2.

In some embodiments, the transistor stack of the memory cell in method 800 includes a number of transistors connected in series between the bit line and a supply node. In these embodiments, box 830 turns off all transistors of the transistor stack to isolate the transistor stack from the memory unit of the memory cell.

The functions of boxes 810, 820, and 830 allow method 800 to reduce a charge leakage from the bit line of the device to save power. The functions of boxes 810, 820, and 830 also allow method 800 to enable the device to achieve a high leakage tolerance to avoid a possibility of a false read of the data stored in the memory cell when the memory cell is accessed during a read operation.

The function in boxes 810, 820, 830 of method 800 may be performed in any order.

In the description of FIG. 1 through FIG. 8, portions and features of the memory cells or the devices in some embodiments may be included in or substituted for those of other embodiments.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A device comprising:
a bit line;
a transistor stack including a first transistor and a second transistor coupled between the bit line and a supply node;
a memory unit including a storage node; and
an isolation unit to isolate the transistor stack from the memory unit, the isolation unit including a pass gate to couple a gate of the first transistor to a gate of the second transistor based on a bit value of the storage node.

2. The device of claim 1, wherein the pass gate includes a first pass node coupled to the gate of the first transistor, a second pass node coupled to the gate of the second transistor, and pass gate control node coupled to the storage node of the memory unit.

3. A device comprising:
a bit line;
a transistor stack coupled between the bit line and a supply node, the transistor stack including a number of transistors coupled in series between the bit line and the supply node, the number of transistors including a first transistor and a second transistor;
a memory unit; and
an isolation unit to isolate the transistor stack from the memory unit, wherein the isolation unit includes a first switch to conditionally couple a gate of the first transistor to a gate of the second transistor based on a bit value of the memory unit, and a second switch to turn off one of the first and second transistors based on the bit value of the memory unit.

4. The device of claim 3, wherein memory unit includes a pair of storage nodes.

5. The device of claim 3 further includes a precharge unit to charge the bit line to a precharged value corresponding to the bit value of the memory unit.

6. The device of claim 5 further includes a keeper unit to keep the bit line at the precharged value when the precharge unit is deactivated.

7. The device of claim 6 further comprising:
a write word line;
a write bit line; and
a write access port responsive to the write word line to transfer data from the write bit line to the memory unit.

8. A device comprising:
a plurality of bit lines;
a plurality of select lines;
a plurality of first memory cells, each of the first memory cells coupled to a first bit line of the plurality of bit lines; and a plurality of second memory cells, each of the second memory cells coupled to a second bit line of the plurality of the bit lines, wherein each memory cell of the first memory cells and the second memory cells includes a transistor stack having a first transistor and a second transistor coupled between one of the bit lines and a supply node, a memory unit including a storage node, and an isolation unit coupled between the transistor stack and the memory units wherein the isolation unit includes a pass gate responsive to a bit value of the storage node to couple a gate of the first transistor and a gate of the second transistor to one of the select lines.

9. The device of claim 8, wherein the memory unit includes:
a first inverter including an input node, and an output node; and
a second inverter including an input node coupled to the output node of the first inverter, and an output node coupled to the input node of the first inverter.

10. The device of claim 8, wherein the pass gate includes a first pass node coupled to the gate of the first transistor, a second pass node coupled to the gate of the second transistor, and pass gate control node coupled to the storage node of the memory unit.

11. A device comprising;
a plurality of bit lines;
a plurality of select lines;
a plurality of first memory cells, each of the first memory cells coupled to a first bit line of the plurality of bit lines; and
a plurality of second memory cells, each of the second memory cells coupled to a second bit line of the plurality of the bit lines, wherein each memory cell of the first memory cells and the second memory cells includes a transistor stack coupled between one of the bit lines and a supply node, a memory unit, and an isolation unit coupled between the transistor stack and the memory unit, the transistor stack including a first transistor and a second transistor coupled in series with the first transistor between the bit line and the supply node, the memory unit including a first inverter including an input node, and an output node, and a second inverter including an input node coupled to the output node of the first inverter, and an output node coupled to the input node of the first inverter, wherein the isolation unit includes:
a pass gate including a first pass gate control node coupled to the input node of the first inverter, a second pass gate control node coupled to the output of the first inverter, a first pass node coupled to a gate of the first transistor of the transistor stack, and a second pass node coupled to a gate of the second transistor of the transistor stack; and
a transistor including a gate coupled to the second pass gate control node, a drain coupled to second pass node, and a source coupled to the supply node.

12. The device of claim 11 further comprising a plurality of precharge transistors, each of the precharge transistors coupled between the second supply node and the transistor stack of a memory cell among the first memory cells and the second memory cells.

13. The device of claim 12 further includes a plurality of keeper units, each of the keeper units including a keeper loop coupled to one of the bit lines.

14. The device of claim 11 further comprising:
a plurality of additional bit lines; and
a plurality of read access ports, each of the read access ports including an additional transistor stack coupled between one of the additional bit lines and the supply node, and an additional isolation unit coupled between the additional transistor stack and the memory unit of a memory cell among the plurality of first memory cells and the plurality of second memory cells.

15. The device of claim 14 further comprising:
a plurality of write word lines;
a plurality of write bit lines; and
a plurality of write access ports, each of the write access ports responsive to one of the write word lines to transfer data from one of the write bit lines to the memory unit of a corresponding memory cell among the first memory cells and the second memory cells.

16. The device of claim 15 further comprising:
a second write word line;
a second write bit line; and
a second write access port responsive to the second write word line to transfer data from the second write bit line to the corresponding memory unit.

17. A system comprising:
a processing unit; and
a cache memory device coupled to the processing unit, at least one of the processing unit and the cache memory device including a register file, the register file including:
a bit line;
a transistor stack including a number of transistors coupled between the bit line and a supply node;
a memory unit to store complementary bit values of a data bit; and
an isolation unit coupled between the transistor stack and the memory unit, wherein the isolation unit includes a first switch to conditionally couple gates of the transistors of the transistor stack based on a first bit value of the complementary bit values, and a switch to turn off one of the transistors based on the first bit value of the complementary bit values.

18. The system claim 17, wherein the register file unit further includes:
a pair of write bit lines;
a write select line; and
a write access port responsive to the write select line to transfer data from the pair of write bit lines to the memory unit.

19. The system of claim 18, wherein the register file further includes:
a second bit line;
a second transistor stack coupled between the second bit line and the supply node; and
a second isolation unit coupled between the second transistor stack and the memory unit.

20. The system of claim 19, wherein the register file further includes:
a first precharge unit to charge the bit line to a precharged value corresponding to a first bit value of the complementary bit values; and
a second precharge unit to charge the second bit line to the precharged value corresponding to the first bit value of the complementary bit values.

21. The system of claim 20, wherein the register file further includes:
a first keeper unit to keep the bit line at the precharged value when the first precharge unit is deactivated; and a second keeper unit to keep the second bit line at the precharged value when the second precharge unit is deactivated.

22. A method comprising:

holding a bit line at a first value when a select line coupled to a memory cell is activated and a memory unit of a memory cell has a first bit value;

creating a conductive path between the bit line and a supply node to change the first value of the bit line to a second value when the select line is activated and the memory unit of the memory cell has a second bit value, wherein the conductive path runs through a first transistor and a second transistor of a transistor stack of the memory cell, and wherein creating the conductive path includes coupling a gate of the first transistor to a gate of the second transistor; and isolating the transistor stack from the memory unit of the memory cell when the select line is deactivated.

23. The method of claim 22, wherein isolating the transistor stack includes decoupling gates of all transistors of the transistor stack from the memory unit.

24. The method of claim 22, wherein isolating the transistor stack includes turning off all transistors of the transistor stack, wherein the transistors are coupled in series between the bit line and the supply node.

25. The method of claim 24, wherein turning off all transistors of the transistor stack occurs independently from a bit value of the memory unit.

26. The method of claim 22, wherein creating a conductive path includes turning on all transistors of the transistor stack, wherein the transistors are coupled in series between the bit line and the supply node.

27. The method of claim 23 further comprising:

activating a write access port to transfer data from a write bit line to the memory cell when a write word line is activated.

28. The method of claim 27 further comprising:

activating a second write access port to transfer data from a second write bit line to the memory cell when a second write word line is activated.

29. The method of claim 22, wherein creating the conductive path further includes coupling the gate of the first transistor and the gate of the second transistor to the select line.

* * * * *